(12) United States Patent
Migita et al.

(10) Patent No.: US 9,425,135 B2
(45) Date of Patent: Aug. 23, 2016

(54) ELECTRODE BODY, WIRING SUBSTRATE, AND SEMICONDUCTOR DEVICE

(71) Applicant: OLYMPUS CORPORATION, Tokyo (JP)

(72) Inventors: Chihiro Migita, Tokyo (JP); Hiroshi Kikuchi, Hidaka (JP); Yoshiaki Takemoto, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 13/851,468

(22) Filed: Mar. 27, 2013

(65) Prior Publication Data

US 2013/0256880 A1    Oct. 3, 2013

(30) Foreign Application Priority Data

Mar. 30, 2012    (JP) ................. 2012-082930

(51) Int. Cl.
*H01L 23/498*    (2006.01)
*H01L 23/00*    (2006.01)
*H01L 21/56*    (2006.01)

(52) U.S. Cl.
CPC ......... *H01L 23/49811* (2013.01); *H01L 24/11* (2013.01); *H01L 24/13* (2013.01); *H01L 24/14* (2013.01); *H01L 24/81* (2013.01); *H01L 21/563* (2013.01); *H01L 24/16* (2013.01); *H01L 24/83* (2013.01); *H01L 2224/119* (2013.01); *H01L 2224/1132* (2013.01); *H01L 2224/1145* (2013.01); *H01L 2224/1146* (2013.01); *H01L 2224/1147* (2013.01); *H01L 2224/1184* (2013.01); *H01L 2224/11318* (2013.01);

(Continued)

(58) Field of Classification Search
CPC ............... H01L 2924/00014; H01L 23/49811; H01L 2224/13111; H01L 2924/00012; H01L 2224/05147; H01L 23/498; H01L 21/60
USPC ........... 257/737, E21.589, E21.158, 741, 466
See application file for complete search history.

(56) References Cited

U.S. PATENT DOCUMENTS

| 2008/0136018 A1* | 6/2008 | Kato et al. ................ 257/737 |
| 2011/0193220 A1* | 8/2011 | Kuo et al. ................. 257/737 |
| 2011/0233767 A1* | 9/2011 | Sakurai ............ H01L 23/49811 257/737 |

FOREIGN PATENT DOCUMENTS

| JP | 2001-267371 A | 9/2001 |
| JP | 2009-302511 A | 12/2009 |
| JP | 2011-210773 A | 10/2011 |

OTHER PUBLICATIONS

Office Action dated Mar. 1, 2016, issued in counterpart Japanese Patent Application No. 2012-082930, with English translation. (5 pages).

*Primary Examiner* — Chuong A Luu
*Assistant Examiner* — Rodolfo Fortich
(74) *Attorney, Agent, or Firm* — Westerman, Hattori, Daniels & Adrian, LLP

(57) ABSTRACT

An electrode body is provided as an electrode body capable of appropriately reducing a load when silicon wafer direct bonding is performed. The electrode body 1 includes a base member 10 that has a predetermined thickness; and an electrode portion 20 that is formed on one surface of the base member in a thickness direction thereof. The electrode portion 20 includes a basic bump 21 formed in a substantially columnar shape to protrude on the base member 10 and a fragile bump 22 formed independently from the basic bump to form a metallic bond with the basic bump 21.

13 Claims, 3 Drawing Sheets

(52) U.S. Cl.
CPC ............... *H01L2224/11845* (2013.01); *H01L 2224/11901* (2013.01); *H01L 2224/131* (2013.01); *H01L 2224/13005* (2013.01); *H01L 2224/13018* (2013.01); *H01L 2224/13023* (2013.01); *H01L 2224/13078* (2013.01); *H01L 2224/13082* (2013.01); *H01L 2224/13111* (2013.01); *H01L 2224/13144* (2013.01); *H01L 2224/13147* (2013.01); *H01L 2224/13155* (2013.01); *H01L 2224/1403* (2013.01); *H01L 2224/16238* (2013.01); *H01L 2224/73204* (2013.01); *H01L 2224/81012* (2013.01); *H01L 2224/81013* (2013.01); *H01L 2224/81022* (2013.01); *H01L 2224/81191* (2013.01); *H01L 2224/81203* (2013.01); *H01L 2224/83104* (2013.01)

ELECTRODE BODY, WIRING SUBSTRATE, AND SEMICONDUCTOR DEVICE

BACKGROUND OF THE INVENTION

1. Field of the Invention

The present invention relates to an electrode body, and more particularly, to an electrode body in which a plurality of electrodes are formed to protrude on a base member and a wiring substrate and a semiconductor device that uses the electrode body.

2. Description of Related Art

With high performance and miniaturization of systems, semiconductor devices are required to have a smaller size and high performance. Therefore, a technique called "silicon wafer direct bonding" of bonding wafers in which a plurality of minute bumps functioning as electrodes are formed has been also examined.

To electrically connect the bumps in the silicon wafer direct bonding, it is necessary to apply a load to the wafer, but the necessary load increases with the number of bumps. For example, when bumps with a diameter of about 10 μm are formed on the entire surface of a wafer of 8 inches (23.2 cm), the number of bumps is hundreds of millions, and thus the load necessary for the bonding becomes several tons.

Here, when the heights of the bumps are irregular, the load is first concentrated on the highly formed bumps, and thus there is a concern that these bumps may be damaged. For this reason, to reduce the bonding load, flattening the upper surfaces of the bumps by grinding, chemical mechanical polishing (CMP), or the like has been investigated. However, flattening the hundreds of millions of bumps uniformly without any damage to the bumps is not easy, and there is a concern with the delivery and the cost.

In regard to this problem, Patent Literature 1 discloses a method of forming minute uneven portions on the upper surfaces of the bumps using a pressing device. The formed minute uneven portions serve as crushing margins that absorb the height irregularity of the bumps, and thus the load necessary for the bonding is considered to be reduced.

[Patent Literature 1] Japanese Unexamined Patent Application, First Publication No. 2001-267371

Technical Problem

However, according to the method disclosed in the Patent Literature 1, there is a problem that plastic deformation caused by the process of pressing occurs in the crystal structure of the bumps such that the effect of reducing the load may be not achieved enough.

The present invention was made in light of the foregoing, and it is an object of the present invention to provide an electrode body, a wiring substrate, and a semiconductor device that can favorably reduce the load during the process of the silicon wafer direct bonding.

SUMMARY OF THE INVENTION

A first aspect of the invention is an electrode body is characterized that includes a base member that has a predetermined thickness; and an electrode portion that is formed on one surface of the base member in a thickness direction thereof. The electrode portion includes a basic bump formed in a substantially columnar shape to protrude on the base member and a fragile bump formed independently from the basic bump to form a metallic bond with the basic bump.

The base member may be formed of a semiconductor or an insulator.

Also, the basic bump may be formed of one of gold, copper, nickel, and an alloy including at least one metal thereof. The fragile bump may be formed of one of gold, copper, nickel, tin and an alloy including at least one metal thereof.

Also, a surface roughness Ra of a surface of the basic bump on which the fragile bump may be formed is equal to or less than 100 nanometers.

The fragile bump may be formed of a granular metal.

The fragile bump may be formed by plating and the granular metal may be formed by growth of a plating nucleus.

A second aspect of the invention is a wiring substrate that is characterized by including the electrode body according to the present invention; and a wiring that is provided in the base member and is connected to the electrode portion.

A third aspect of the invention is a semiconductor device that is characterized by including the wiring substrate according to the present invention; and a semiconductor element, a semiconductor chip or a semiconductor package that are provided in the base member.

Another semiconductor device according to the present invention is a semiconductor device formed by bonding at least two wiring substrates in which an electrode portion is formed, and the semiconductor device is characterized that at least one of the wiring substrates is the wiring substrate of the present invention or the wiring substrate of the semiconductor device of the present invention.

Advantageous Effects of Invention

According to the electrode body, the wiring substrate, and the semiconductor device of the present invention, the load during the process of the silicon wafer direct bonding can be favorably reduced.

DETAILED DESCRIPTION OF THE INVENTION

An embodiment of the invention will be described with reference to FIGS. 1 to 8.

Figure 1:
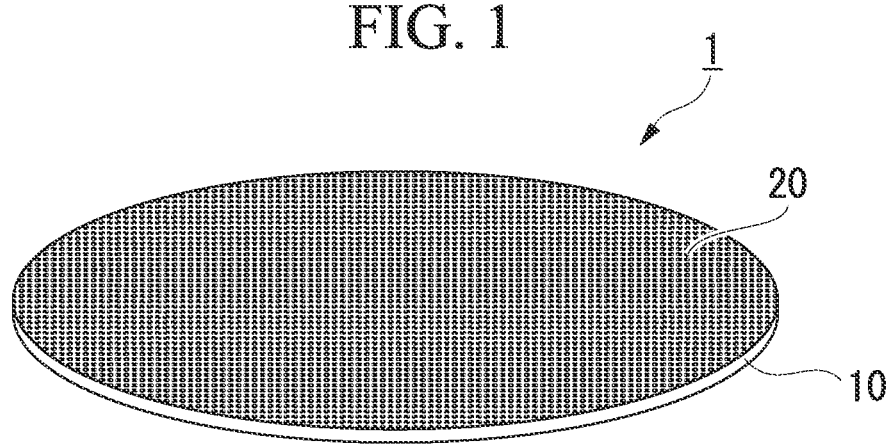
FIG. 1 is a perspective view illustrating an electrode body according to an embodiment of the invention.

FIG. 1 is a perspective view illustrating an electrode body 1 according to this embodiment. The electrode body 1 includes a plate-shaped or sheet-shaped base member 10 and a plurality of electrode portions 20 formed on the surface of the base member 10.

The base member 10 is formed of an insulator or a semiconductor and has a plate shape or a sheet shape with a predetermined thickness. Examples of the insulator and the semiconductor forming the base member 10 may include silicon, resin, ceramics, and glass. In this embodiment, a silicon wafer is used as the base member 10.

Figure 2:
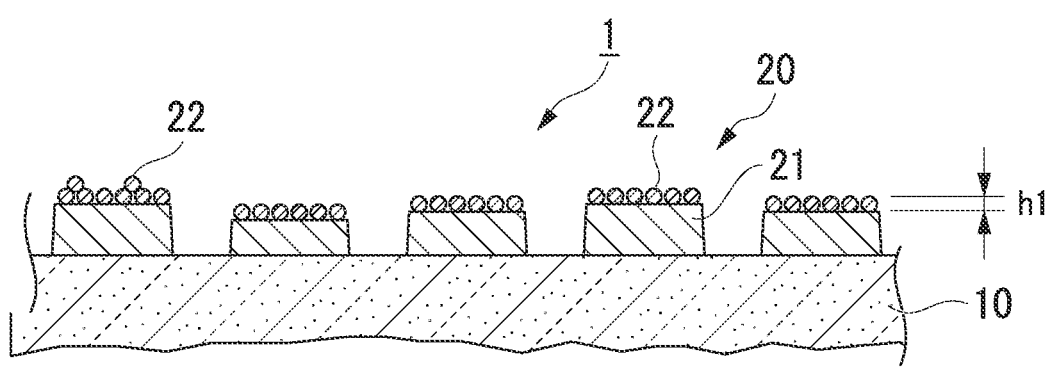
FIG. 2 is an expanded sectional view illustrating electrode portions of the electrode body.

FIG. 2 is an expanded sectional view illustrating the electrode portions 20 of the electrode body 1. Each electrode portion 20 includes a basic bump 21 formed in a substantially columnar shape and fragile bumps 22 formed on the upper surface of the basic bump 21, and thus is formed to protrude on the surface of the base member 10.

The basic bump 21 forms the basic shape of the electrode portion 20 and is formed of a conductive material such as a metal. Examples of the metal forming the basic bump 21 may include gold, copper, nickel, and an alloy including at least one of these metals.

The fragile bumps 22 are formed as a structure independent from the basic bump 21 so as to come into contact with the basic bump 21. That is, the fragile bumps 22 are not formed, for example, by deforming a part of the basic bump 21 but are independently formed on the basic bump 21. When the fragile bumps 22 are observed in an expansion manner using an electron microscope or the like, discontinuity in the structure can be confirmed. The fragile bumps 22 according to this embodiment are formed of a granular metal. As the material of the fragile bumps 22, a metal such as gold, copper, nickel, tin, an alloy including at least one of these metals, or the like can be used. The material of the basic bump 21 and the material of the fragile bumps 22 may be the same or may be different.

Since the fragile bumps 22 have a fine structure than the basic bump 21, the fragile bumps 22 are deformed more easily than the basic bump 21. Since the fragile bumps 22 form a metallic bond with the basic bump 21, the electric connection with the basic bump 21 is ensured.

A height h1 of each fragile bump is preferably set to a value equal to or greater than a height irregularity (a difference between the minimum value and the maximum value) when the basic bump is formed. Thus, when bonding is performed, as will be described below, the height irregularity of the basic bumps can be appropriately absorbed, and thus certainty of the bonding of the electrode portions can be improved.

A surface roughness Ra on the upper surface of the basic bump 21 is considered to be preferably equal to or less than 100 nanometers (nm), since the function of the fragile bumps 22 to be described below can be sufficiently exerted. Not only may the fragile bumps be formed such that granular metals overlap in one layer, but the fragile bumps may also be formed such that granular metals overlap in two or more layers, as shown in FIG. 2.

An example of a method of manufacturing the electrode body 1 with the above-described configuration will be described.

Figure 3:
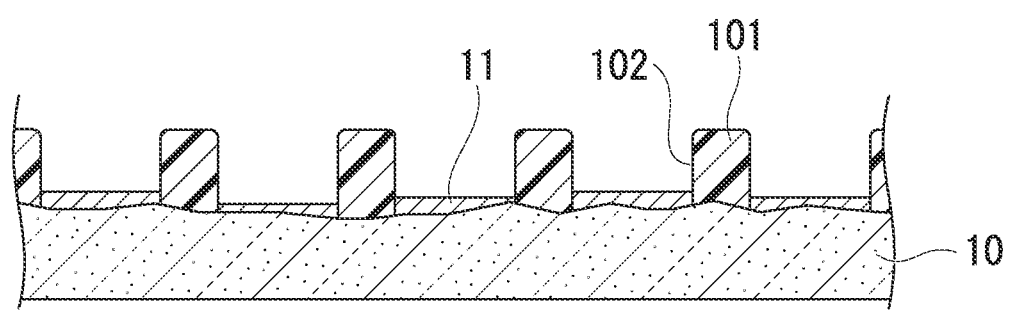
FIG. 3 is a diagram illustrating one process in an example of a method of manufacturing the electrode body.

First, resist layers 101 are formed on the base member 10. As shown in FIG. 3, a plurality of openings 102 according to a pattern for formation of the electrode portions are formed in the resist layers 101. The openings 102 are formed in the base member 10 and are formed to match the positions of electrode pads 11 that also function as a seed layer.

Figure 4:
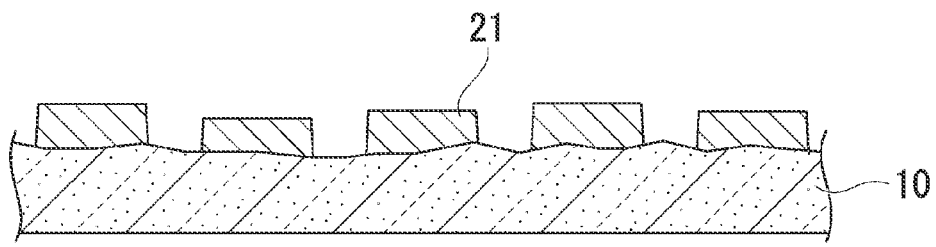
FIG. 4 is a diagram illustrating one process in the example of the method of manufacturing the electrode body.

Next, when the respective opening 102 are filled with a conductive material by plating or the like and the resist layers 101 are removed, the basic bumps 21 are completed, as shown in FIG. 4. The formed basic bumps 21 have irregular predetermined heights.

Figure 5:
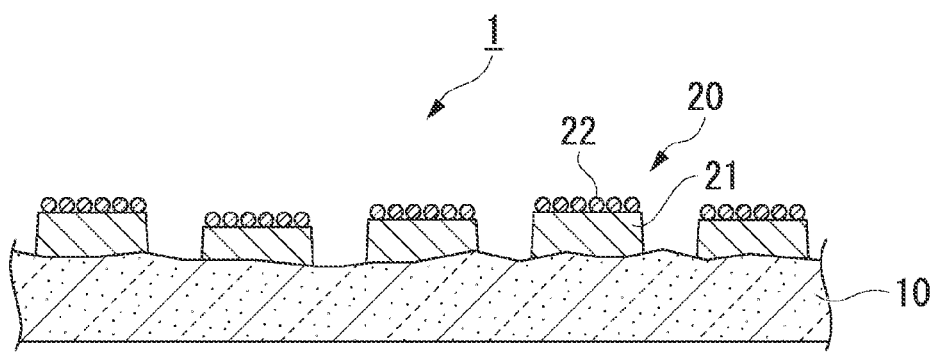
FIG. 5 is a diagram illustrating one process in the example of the method of manufacturing the electrode body.

Next, the upper surface of each basic bump 21 is subjected to plating. Then, the metal included in a plating solution is precipitated as nuclei on the upper surface of the basic bump 21. Thereafter, when the nuclei grow, granular metal objects are formed on the upper surface of the basic bump 21 so as to be independent from the basic bump 21. Thus, as shown in FIG. 5, the fragile bumps 22 that form a metallic bond with the basic bump 21 are formed.

When the basic bumps and the fragile bumps are formed of the same material and are both formed by plating, the basic bumps and the fragile bumps can be formed by a series of plating processes. However, even in this case, from the viewpoint of the fact that the fragile bumps sufficiently function, the fragile bumps are preferably formed such that the surface roughness Ra of the upper surface of the basic bumps is equal to or less than 100 nanometers (nm) by flattening the upper surfaces of the basic bumps by CMP or the like after the basic bumps are formed.

When forming of the fragile bumps 22 ends, manufacturing of the electrode body 1 including the electrode portions 20 is completed. Here, when the base member 10 is formed of an insulator, as in this embodiment, a wiring electrically connected to at least one of the electrode portions 20 may be formed in the base member 10. As the form of the wiring, the wiring may be formed in one surface or both surfaces of the base member 10 in the thickness direction thereof by printing, etching, or the like, may be formed through the base member, as in a via or the like, may be formed as a stereoscopic wiring by a lamination technique, or may be formed by an appropriate combination thereof. The electrode body according to the present invention can be used as a so-called wiring substrate by installing wirings in a predetermined form in the base member. The wirings may be installed before the electrode portions 20 are formed or may be formed after the electrode portions 20 are formed.

In a combination of the electrode formation bodies serving as the wiring substrates, a combination of the wiring substrate and the electrode body in which semiconductor elements are formed, or a combination of the electrode formation bodies in which semiconductor elements are formed, the surfaces thereof on which the electrode portions 20 are formed face each other. When the positions of the electrode portions are aligned and the electrode portions are integrally bonded, the electrode portions are electrically bonded, and thus a semiconductor device is formed.

Figure 6:
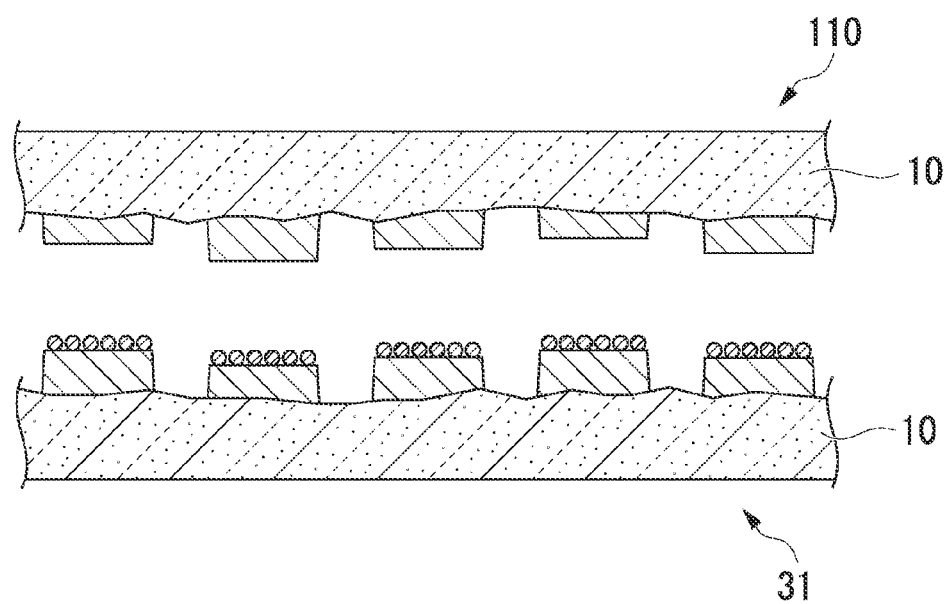
FIG. 6 is a diagram illustrating one process when wiring substrates using the electrode body are bonded.
Figure 7:
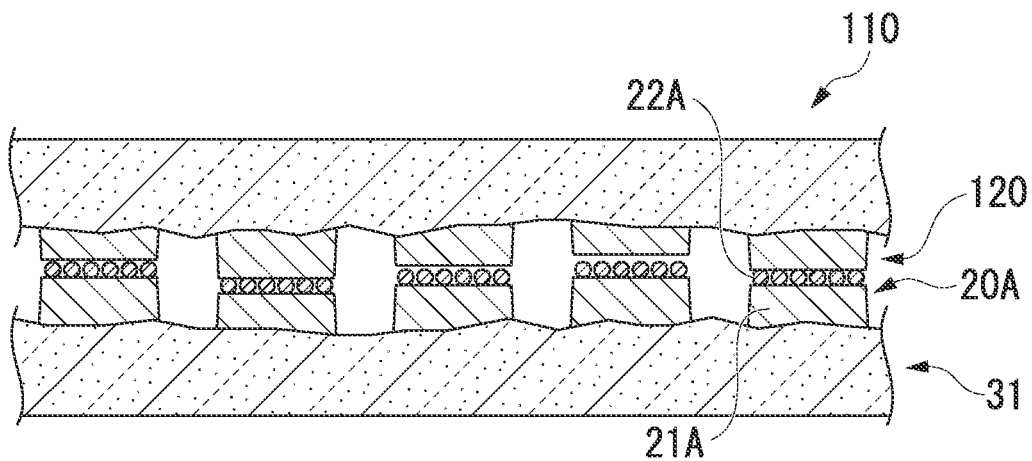
FIG. 7 is a diagram illustrating one process when the wiring substrates using the electrode body are bonded.
Figure 8:
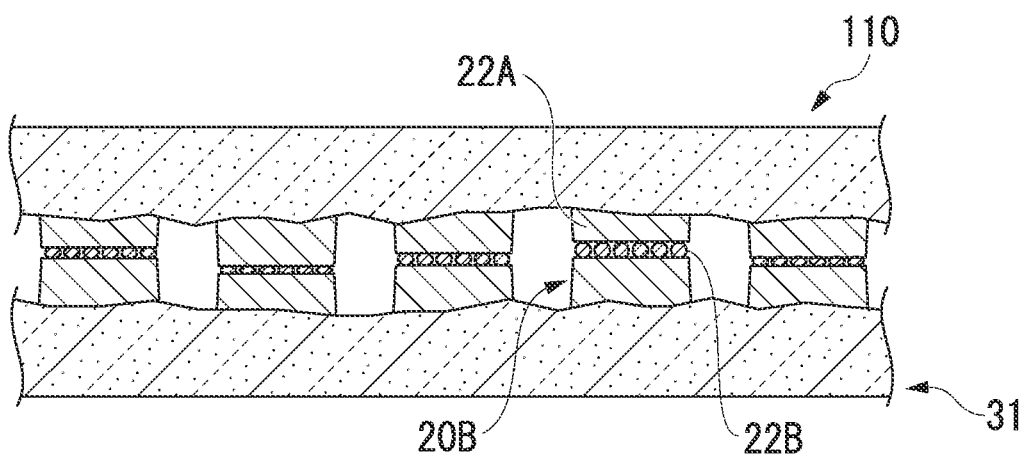
FIG. 8 is a diagram illustrating one process when the wiring substrates using the electrode body are bonded.

Operations and advantages of the electrode body 1 when the bonding is performed will be described with reference to FIGS. 6 to 8. FIGS. 6 to 8 are diagrams illustrating an example in which electrode portions 120 including only basic bumps 21 and no fragile bumps are formed in an upper-side wiring substrate 110 which is the other-side bonding substrate. A wiring is formed in each substrate, although not illustrated.

First, as shown in FIG. 6, a wiring substrate 31 in which a wiring is formed in the electrode body 1 and the other-side wiring substrate 110 are positioned to face each other. When the substrates are positioned, a known wafer bonding device or the like can be used. Before the bonding, the base member surface of each wiring substrate and the electrode portions may be cleaned by plasma cleaning, reverse sputtering, or the like.

Next, when the wiring substrates are pressurized while being heated, as shown in FIG. 7, the electrode portions 20A of the wiring substrate 31 approach the electrode portions 120 of the wiring substrate 110. Then, fragile bumps 22A on the basic bumps 21A which are the closest to the facing electrode portions 120 come into contact with the facing electrode portions 120 of the wiring substrate 110.

A relatively large load is applied to the electrode portions initially coming into contact with the facing electrode portions 120, but the fragile bumps 22A receiving this load are quickly deformed and the other fragile bumps of the other electrode portions gradually come into contact with the facing electrode portions in sequence. At this time, some of the fragile bumps are moved to be sunken into the upper surfaces of the basic bumps 21A or the upper surfaces of the electrode portions 120 due to the concentration of the load, instead of being deformed. Due to the two kinds of behavior of the fragile bumps, the electrode portions of the wiring substrates 31 and 110 facing each other are reliably connected electrically.

When the fragile bump 22A initially coming into contact with the electrode portion is sufficiently deformed or sunken, as shown in FIG. 8, the electrode portions come into contact with each other by the electrode portion 20B which is the farthest from the facing electrode portion 120 of the wiring substrate 110 or the fragile bump 22B, and thus are electrically connected to each other.

In the electrode body 1 according to this embodiment, as described above, the electrode portion 20 includes the basic bump 21 and the fragile bumps 22 formed on the upper surface of the basic bump 21. Therefore, when the electrode bonding is performed, the fragile bumps first come into contact with the other-side electrode portion. Then, the fragile bumps are quickly deformed due to the relatively large load at the initial contact time, and thus the load applied to the base member or the electrode portion is reduced.

Accordingly, it is possible to appropriately prevent the base member or the electrode portion from being damaged due to a large load at the initial contact time.

Since the fragile bumps 22 are formed as the structure independent from the basic bump 21 on the basic bump 21, for example, the phenomenon in which the basic bump is hardened when formed does not occur, as in the method disclosed in the Patent Literature 1 or the like. Accordingly, since the fragile bumps are deformed and sunken and thus appropriately function as so-called "crushing margins," the electrode portions can be reliably connected to each other by wafer direct bonding by setting the height h1 of each fragile bump to a value equal to or greater than the height irregularity of the basic bumps.

Further, since only the fragile bumps are deformed in the electrode portion 20 and the electrode portions are connected to each other with little deformation of the basic bumps, the size of the gap between the wiring substrates can be controlled with high accuracy. As a result, even when a resin or the like is injected into the gap to protect the electrode portions after the connection of the electrode portions, the resin can be appropriately injected.

When the fragile bumps are formed by plating, precipitation of the nuclei can be used. Therefore, the fragile bumps can easily be formed.

The example in which the electrode portion of the other-side wiring substrate to be bonded does not include the fragile bumps has been described above, but the shape of the electrode portion of the other side is not particularly limited. Accordingly, the fragile bumps may be formed on the other side, or the relatively flattened electrode portions formed at substantially the same height as a wiring on the base member may be formed on the other side.

Even when the electrode portions of the other side do not include the fragile bumps, as in the above-described embodiment, and the electrode portions with irregular heights of a predetermined range are formed, the maximum gap between the electrode portions when the bonding is performed is theoretically a sum of the irregularity values of the heights of both electrode portions. Therefore, by setting the height of the fragile bump to a value equal to or greater than the sum, the electrode portions can be bonded more reliably.

The embodiment of the invention has been described, but the technical scope of the invention is not limited to the above-described embodiment, but may be modified within the scope of the invention without departing from the gist of the invention by changing combinations of the constituent elements, modifying the constituent elements, or eliminating the constituent elements.

First, the method of forming the fragile bumps is not limited to the above-described plating method, and the fragile bumps may be also formed by vapor deposition, sputtering, or printing of a metal material or dropping of minute droplets of melted solder.

Figure 9:
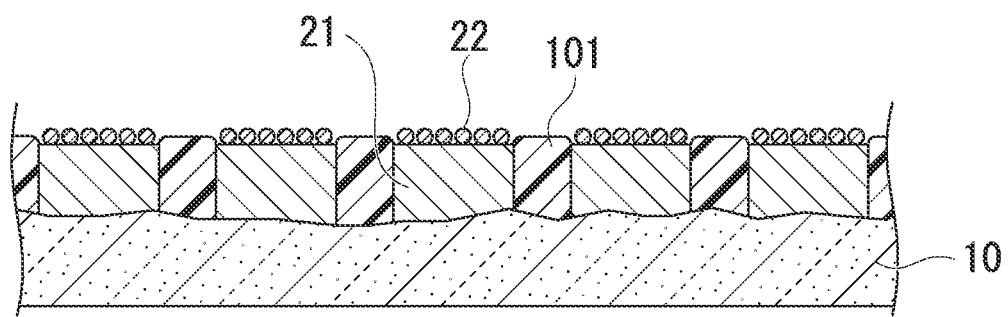
FIG. 9 is a diagram illustrating one process in a method of manufacturing the electrode body according to a modification example.

In the example of the above-described manufacturing method, the example in which the fragile bumps are formed after the resist layers used to form the basic bumps are removed has been described. However, the fragile bumps may be formed when the resist layers 101 remain, as in a modification example shown in FIG. 9.

The electrode portions may be formed on both surfaces of the base member in the thickness direction thereof. The wiring substrate according to the invention in which the electrode portions are formed on both surfaces can be used as a so-called interposer.

In the electrode body or the wiring substrate according to the invention, not only the semiconductor element but also a semiconductor chip in which a semiconductor element is formed or a semiconductor package including a semiconductor chip may be mounted or included. In this case, the wiring substrate according to the invention can function as a semiconductor device in a state before the bonding.

A kind of semiconductor device configured by forming a single wiring substrate, a single semiconductor device, or the like or by bonding wiring substrates, semiconductor devices, or the like according to the invention is not particularly limited. For example, in a solid-state imaging device or the like including a plurality of pixels, it is necessary to form many electrodes at a narrow pitch. Therefore, the advantages obtained by applying the invention are considerable and the configuration of the invention can be suitably applied.

Further, the base member in the electrode body according to the invention is not limited to an insulator. For example, the electrode body in which the electrode portions are formed in a metallic base member with relatively high rigidity can be suitably used as a transfer electrode body used to transfer formed electrode portions to another base member. In this case, in the transferred electrode portions, the fragile bumps are located between the base member and the base bumps, but likewise function as crushing margins and the same advantages can be obtained.

REFERENCE SIGNS LIST 1 electrode body
10 base member
20, 20A, 20B electrode portion
21, 21A basic bump
22, 22A, 22B fragile bump
31 wiring substrate

What is claimed is:
1. An electrode body forming method comprising the steps of:
 forming a base member having a predetermined thickness; and forming a plurality of electrode portions on one surface of the base member in a thickness direction of the base member, wherein the step of forming the plurality of electrode portions comprises the steps of:

forming a plurality of basic bumps that are formed to protrude on the base member, each of the plurality of the basic bumps being formed in a substantially columnar shape, and forming one or more fragile bumps that are formed on an upper surface of each of the basic bumps, independently from the basic bump, wherein a metallic bond is formed between the fragile bumps and the basic bump on which the fragile bumps are formed, wherein the fragile bumps and the basic bumps are formed of the same material, and wherein a height of each fragile bump is equal to or greater than a height irregularity of the basic bumps.

2. The electrode body forming method according to claim 1, further comprising a step of forming a resist pattern.

3. The electrode body forming method according to claim 1, wherein the base member is formed of one of a group consisting of a semiconductor and an insulator.

4. The electrode body forming method according to claim 1, wherein the basic bump is formed of one of a group consisting of gold, copper, nickel, and an alloy including at least one of gold, copper and nickel, and wherein the fragile bump is formed of one of a group consisting of gold, copper, nickel, tin and an alloy including at least one of gold, copper and nickel.

5. The electrode body forming method according to claim 1, wherein a surface roughness Ra of a surface of the basic bump on which the fragile bumps are formed is equal to or less than 100 nanometers.

6. The electrode body forming method according to claim 1, wherein the fragile bump is formed of a granular metal.

7. The electrode body forming method according to claim 6, wherein the fragile bump is formed by plating, and the granular metal is formed by growth of a plating nucleus.

8. An electrode body comprising:

a base member having a predetermined thickness; and a plurality of electrode portions that are formed on one surface of the base member in a thickness direction of the base member, wherein each electrode portion includes a basic bump formed in a substantially columnar shape to protrude on the base member and one or more fragile bumps formed on an upper surface of the basic bump, independently from the basic bump, so as to form a metallic bond with the basic bump, wherein the fragile bumps and the basic bump are formed of the same material, and wherein a height of each fragile bump is equal to or greater than a height irregularity of the basic bumps of the plurality of electrode portions.

9. The electrode body according to claim 8, wherein the base member is formed of one of a group consisting of a semiconductor or an insulator.

10. The electrode body according to claim 8, wherein the basic bump is formed of one of a group consisting of gold, copper, nickel, and an alloy including at least one of gold, copper and nickel, and wherein the fragile bump is formed of one of a group consisting of gold, copper, nickel, tin and an alloy including at least one of gold, copper and nickel.

11. The electrode body according to claim 8, wherein a surface roughness Ra of a surface of the basic bump on which the fragile bumps are formed is equal to or less than 100 nanometers.

12. The electrode body according to claim 8, wherein the fragile bump is formed of a granular metal.

13. The electrode body according to claim 12, wherein the fragile bump is formed by plating, and the granular metal is formed by growth of a plating nucleus.

* * * * *